(12) United States Patent
Gorin et al.

(10) Patent No.: US 6,980,915 B2
(45) Date of Patent: Dec. 27, 2005

(54) PHASE NOISE COMPENSATION FOR SPECTRAL MEASUREMENTS

(75) Inventors: Joseph M. Gorin, Santa Rosa, CA (US); Philip Ivan Stepanek, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/807,205

(22) Filed: Mar. 23, 2004

(65) Prior Publication Data

US 2005/0216214 A1     Sep. 29, 2005

(51) Int. Cl.[7] .............................................. G06F 19/00
(52) U.S. Cl. .................. 702/111; 375/226; 375/227; 324/617; 324/622; 324/76.22; 331/44; 702/69; 702/72
(58) Field of Search .................. 702/111, 106, 107, 702/69, 72; 331/18, 19, 44; 324/613, 614, 324/615, 617, 620, 624, 622, 76.19, 76.22; 375/224, 226, 227

(56) References Cited

U.S. PATENT DOCUMENTS

| | | | | |
|---|---|---|---|---|
| 5,172,064 A | * | 12/1992 | Walls | 324/601 |
| 5,416,422 A | * | 5/1995 | Dildine | 324/614 |
| 6,246,717 B1 | * | 6/2001 | Chen et al. | 375/226 |
| 6,263,289 B1 | * | 7/2001 | Hassun et al. | 702/69 |
| 6,313,619 B1 | * | 11/2001 | Roth | 324/76.19 |
| 6,335,615 B1 | * | 1/2002 | Gorin | 324/76.39 |
| 6,370,484 B1 | * | 4/2002 | Gorin et al. | 702/66 |
| 6,393,372 B1 | * | 5/2002 | Rzyski | 702/111 |
| 6,621,277 B2 | * | 9/2003 | Mar | 324/622 |
| 6,640,193 B2 | * | 10/2003 | Kuyel | 702/69 |
| 6,661,836 B1 | * | 12/2003 | Dalal et al. | 375/226 |
| 6,701,265 B2 | * | 3/2004 | Hill et al. | 702/91 |
| 6,714,898 B1 | * | 3/2004 | Kapetanic et al. | 702/191 |

OTHER PUBLICATIONS

Agilent Technologies Internet Web Page entitled: "ESA-E Series Opt 226 Phase Noise Measurement", date unknown, 1 page.*

Agilent Technologies Product Overview entitled "Phase Noise Measurement Personality for the Agilent ESA-E Series Spectrum Analyzers", date unknown, 8 pages.*

Agilent Technologies Technical Overview entitled: Agilent ESA-E Series Spectrum Analyzers Noise Figure Measurements Personality, date unknown, 20 pages.*

* cited by examiner

Primary Examiner—Patrick J. Assouad
(74) Attorney, Agent, or Firm—John L. Imperato

(57) ABSTRACT

A system and method compensate for phase noise of a spectrum analyzer based on an established model of the phase noise that accommodates a variety of operating states of the spectrum analyzer. The model is used to form an array that is applied to extract an output signal from measurement traces that are acquired by the spectrum analyzer.

20 Claims, 6 Drawing Sheets

PHASE NOISE COMPENSATION FOR SPECTRAL MEASUREMENTS

BACKGROUND OF THE INVENTION

The performance of spectrum analyzers can be degraded by phase noise that is inherent within the spectrum analyzers. For example, phase noise can reduce measurement accuracy of a spectrum analyzer when the phase noise of the spectrum analyzer can not be isolated from signal measurements that are performed by the spectrum analyzer. Phase noise can also limit measurement sensitivity of the spectrum analyzer. If the phase noise of the spectrum analyzer is sufficiently high relative to the signals being measured, the signals can be masked by the phase noise and go undetected by the spectrum analyzer. Unfortunately, decreasing the phase noise of the spectrum analyzer to improve the measurement accuracy and measurement sensitivity can be costly or difficult to achieve, due to inherent noise within local oscillators, frequency references and other components of the spectrum analyzers that contribute to phase noise. Accordingly, there is motivation to compensate for the effects of phase noise on the measurements acquired by spectrum analyzers.

One phase noise compensation technique is used in the Option 226 *Phase Noise Measurement Personality* for the AGILENT TECHNOLOGIES, INC. model E440A PSA series Spectrum Analyzer. This technique includes characterizing the phase noise of the spectrum analyzer by stimulating the spectrum analyzer with a signal having phase noise that is substantially lower than that of the spectrum analyzer, and then measuring the stimulus signal. The resultant phase noise from the measured stimulus signal is subtracted on a linear power scale from subsequent signal measurements that are performed by the spectrum analyzer. This phase noise characterization pertains only to the one particular operating state of the spectrum analyzer at which the stimulus signal is measured. Therefore, in order to compensate for phase noise using this technique, the characterization is typically performed upon each change of the operating state of the spectrum analyzer, which increases measurement set-up time for the spectrum analyzer.

SUMMARY OF THE INVENTION

A system and method according to embodiments of the present invention compensate for phase noise of a spectrum analyzer based on an established model of the phase noise that accommodates a variety of operating states of the spectrum analyzer. The model is used to form an array that is applied to extract an output signal from measurement traces that are acquired by the spectrum analyzer.

DETAILED DESCRIPTION OF THE EMBODIMENTS

Figure 1A:
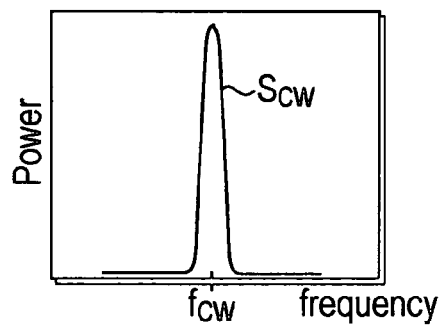
FIGS. 1A–1F show exemplary signals relevant to spectral measurements by a spectrum analyzer.
Figure 1B:
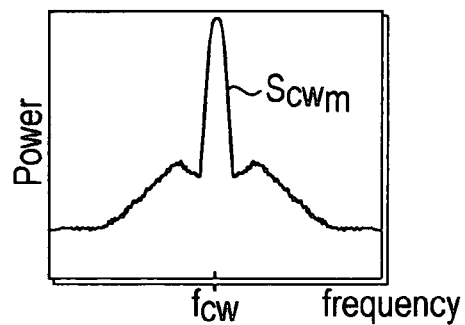

FIGS. 1A–1F show exemplary signals relevant to spectral measurements acquired by a typical spectrum analyzer. FIG. 1A shows a low noise continuous wave signal $S_{CW}$, at a frequency $f_{CW}$. FIG. 1B shows a measured signal $S_{CW}m$ that results when the low noise continuous wave signal $S_{CW}$ is measured by a spectrum analyzer. The spectrum analyzer has a phase noise $\phi_{SA}$ in the operating state at which the continuous wave signal $S_{CW}$ is measured. The measured signal $S_{CW}m$ includes the phase noise $\phi_{SA}$ contributed by the spectrum analyzer and can be expressed as $S_{CW}m=S_{CW}+S_{CW}*\phi_{SA}$, where * indicates convolution. Thus, the measured signal $S_{CW}m$ can be expressed as the low noise continuous wave signal $S_{CW}$ signal plus the low noise continuous wave signal $S_{CW}$ convolved with the phase noise $\phi_{SA}$ of the spectrum analyzer.

Figure 1C:
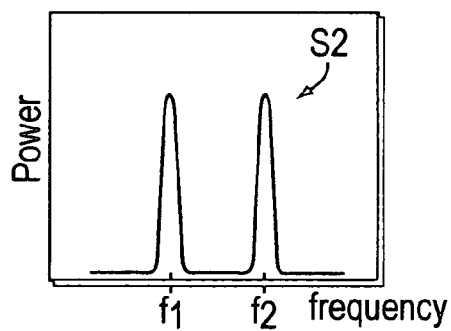
Figure 1D:
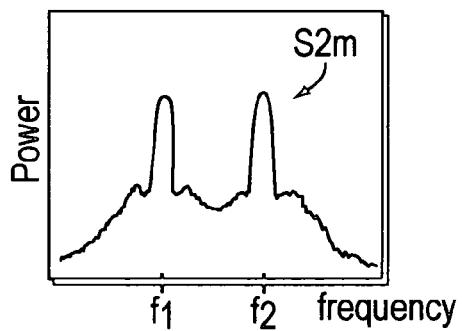
Figure 1E:
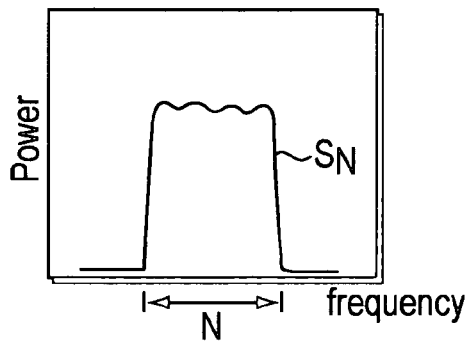
Figure 1F:
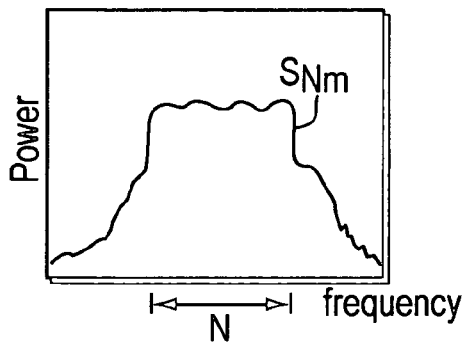

FIG. 1C shows a low-noise two-tone signal S2 at frequencies $f_1$ and $f_2$. FIG. 1D shows a measured signal S2$m$ that results when the low-noise two-tone signal S2 is measured by the spectrum analyzer. The measured signal S2$m$ includes phase noise $\phi_{SA}$ contributed by the spectrum analyzer and can be expressed as $S2m=S2+S2*\phi_{SA}$. FIG. 1E shows a noisy signal $S_N$ having a signal bandwidth N. FIG. 1F shows a measured signal $S_Nm$ that results when the noisy signal $S_N$ is measured by the spectrum analyzer. The measured signal $S_Nm$ includes phase noise $\phi_{SA}$ contributed by the spectrum analyzer and can be expressed as $S_Nm=S_N+S_N*\phi_{SA}$.

In each instance, the phase noise $\phi_{SA}$ of the spectrum analyzer influences the measurements of signals that are applied to the spectrum analyzer. When a signal $S_{IN}$ is applied to a typical spectrum analyzer, a measurement trace $S_{MEAS}$ acquired by the spectrum analyzer can be expressed as the applied signal $S_{IN}$ plus the applied signal $S_{IN}$ convolved with the phase noise $\phi_{SA}$ of the spectrum analyzer, as indicated in equation 1.

$$S_{MEAS}=S_{IN}+S_{IN}*\phi_{SA} \quad (1)$$

Figure 2:
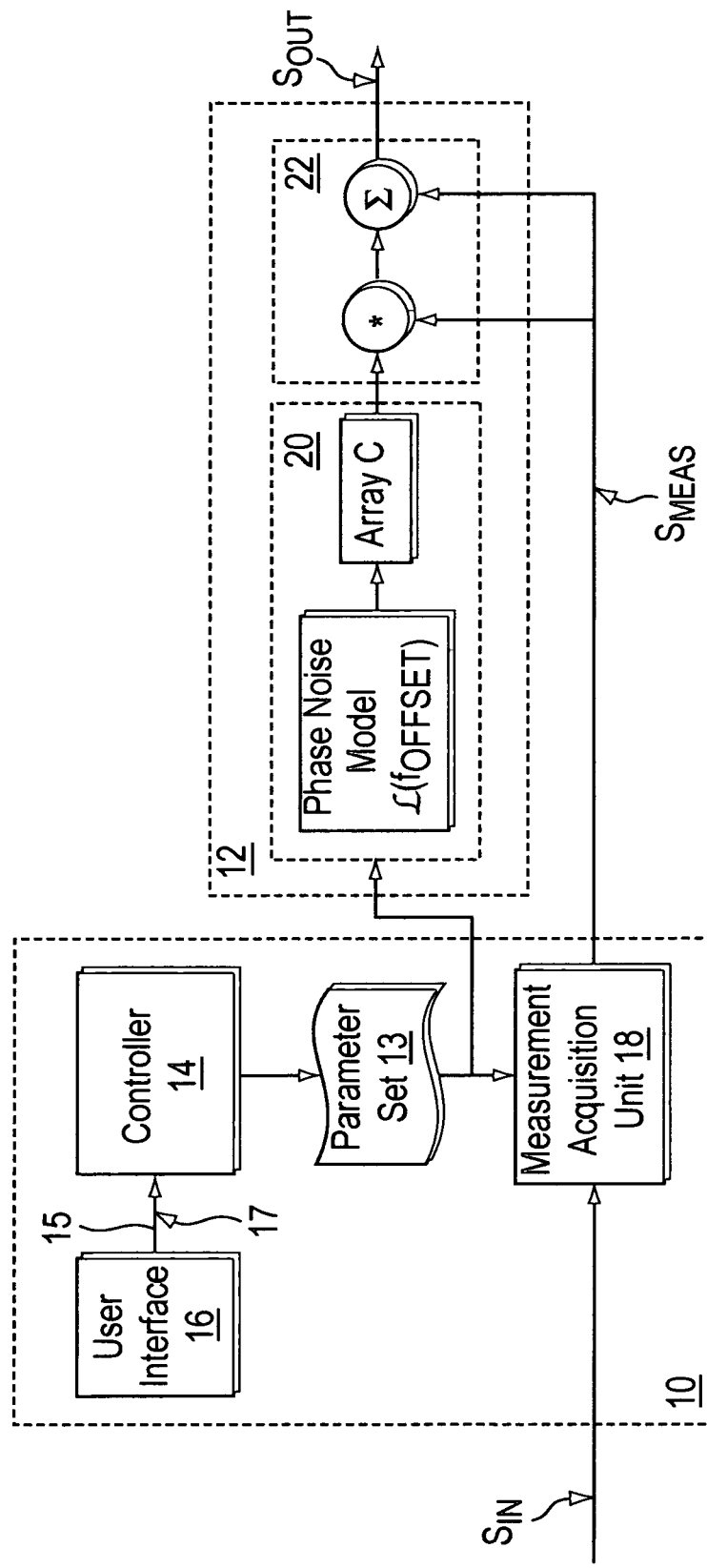
FIG. 2 shows a block diagram of a phase noise compensation system according to embodiments of the present invention.

FIG. 2 shows a conventional spectrum analyzer 10, including a phase noise compensation system 12 in accordance with the embodiments of the present invention. The spectrum analyzer 10 includes a controller 14, typically a computer or other type of processor, that is coupled to a keyboard, touch screen, or other type of user interface 16. The user interface 16 can also be a computer that is coupled to the spectrum analyzer 10 via an interface bus or other communication path 15.

Figure 3:
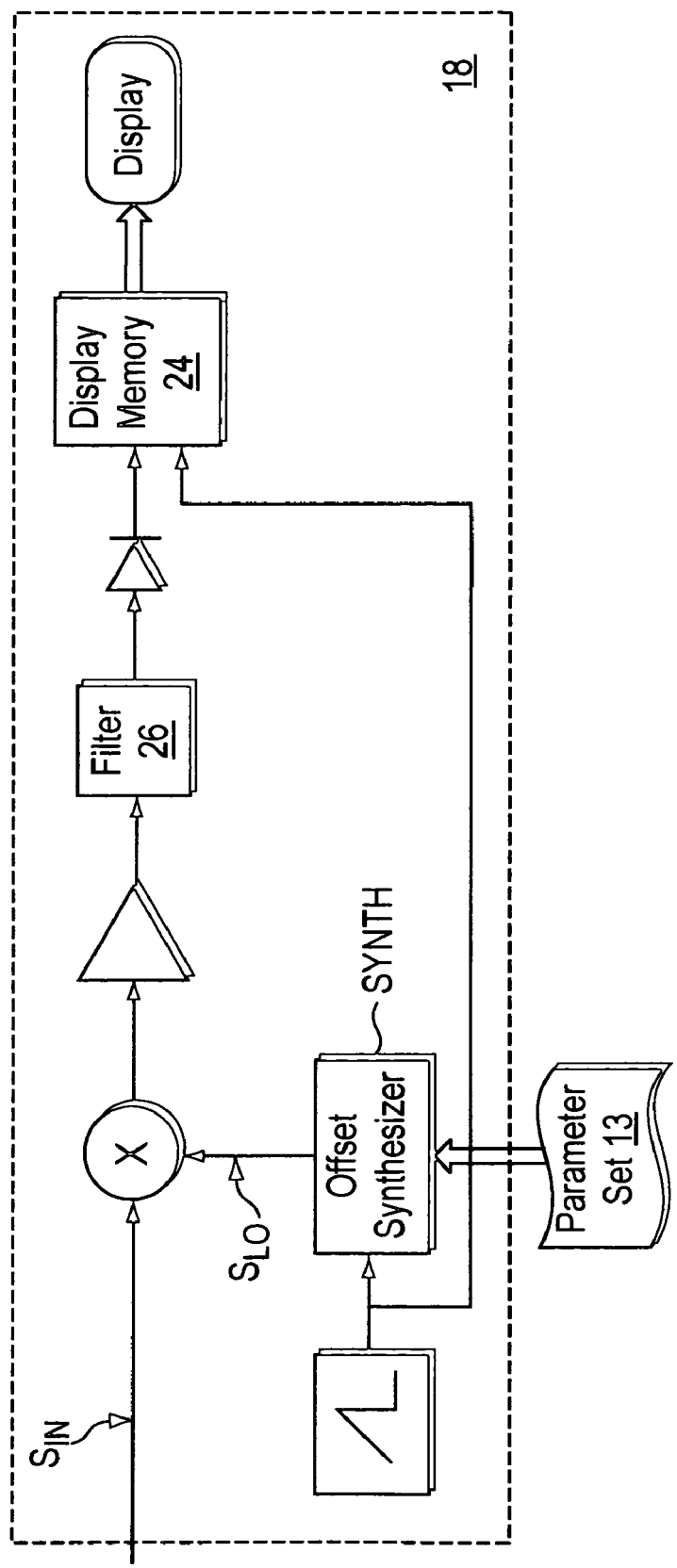
FIG. 3 shows a block diagram of a measurement acquisition unit of a conventional spectrum analyzer.

The user interface 16 provides an input 17, to the controller 14, which is used to adjust the operating state of the spectrum analyzer 10. The operating state includes the center frequency CF, the frequency span SPAN, and resolution bandwidth RBW settings for a measurement acquisition unit 18 of the spectrum analyzer 10. However, there may be additional operating states, or operating states that are different from these exemplary operating states, depending on the measurement acquisition unit 18 of the spectrum analyzer 10. The measurement acquisition unit 18 includes the components, elements or subsystems used to characterize the spectral content of signals $S_{IN}$ that are applied to the spectrum analyzer 10. FIG. 3 shows a simplified block diagram of the measurement acquisition unit 18 of a conventional spectrum analyzer 10, such as an AGILENT TECHNOLOGIES, INC. model E4440 PSA series Spectrum Analyzer, that includes an offset synthesizer SYNTH. The offset synthesizer SYNTH provides a local oscillator signal $S_{LO}$ that establishes the center frequency CF and frequency span SPAN for the measurements performed by the spectrum analyzer 10. A filter 26 establishes the resolution bandwidth RBW for the measurements performed by the spectrum analyzer 10. The operation of a conventional spectrum analyzer is described, for example, in *Spectrum Analysis Basics*, Application Note 150, provided by AGILENT TECHNOLOGIES, INC., Palo Alto, Calif., USA.

The operating states of the spectrum analyzer 10 are set according to parameters within a designated parameter set 13 associated with the spectrum analyzer 10. The parameters are adjusted, set or otherwise designated via the controller 14 in response to the inputs provided by the user interface 16. An exemplary parameter set 13, tabulated in table 1, designates the operating states of a spectrum analyzer 10 that includes an offset synthesizer SYNTH in the measurement acquisition unit 18.

| Parameter | Parameter designation |
|---|---|
| Sampler IF frequency | $f_{SIF}$ |
| Sampler IF polarity | P |
| Sampler harmonic number | N |
| PLL divide ratio | R |

The parameter settings that designate the operating states of the spectrum analyzer 10 also influence the phase noise $\phi_{SA}$ of the spectrum analyzer 10. For the parameter set 13 of table 1, the sampler IF frequency (intermediate frequency) $f_{SIF}$, sampler IF polarity P, sampler harmonic number N and PLL (phase lock loop) divide ratio R within the offset synthesizer SYNTH of the measurement acquisition unit 18 impact the phase noise $\phi_{SA}$ of the spectrum analyzer 10. Thus, when a signal $S_{IN}$ is measured by the spectrum analyzer 10, the parameter settings that designate the operating state of the spectrum analyzer 10 for the measurement also establish the phase noise $\phi_{SA}$ that is contributed to the measurement by the spectrum analyzer 10.

The phase noise compensation system 12 shown in FIG. 2 includes a computational unit 20 and a signal processor 22. While the computational unit 20 and the signal processor 22 are shown separate from the controller 14, the computational unit 20 and the signal processor 22 are typically implemented within the controller 14. The computational unit 20 forms an array C from a phase noise model $\mathcal{L}(f_{OFFSET})$ that represents the phase noise $\phi_{SA}$ of the spectrum analyzer 10 at frequency offsets $f_{OFFSET}$ The phase noise model $\mathcal{L}(f_{OFFSET})$ is based on the parameter settings that correspond to the operating state of the spectrum analyzer 10. The signal processor 22 applies the array C to measurements of the signal $S_{IN}$, acquired by the measurement acquisition system 18, to extract an output signal $S_{OUT}$. The output signal $S_{OUT}$ is a representation of the signal $S_{IN}$ that includes compensation to reduce the influence of the phase noise $\phi_{SA}$ of the spectrum analyzer 10.

Figure 4:
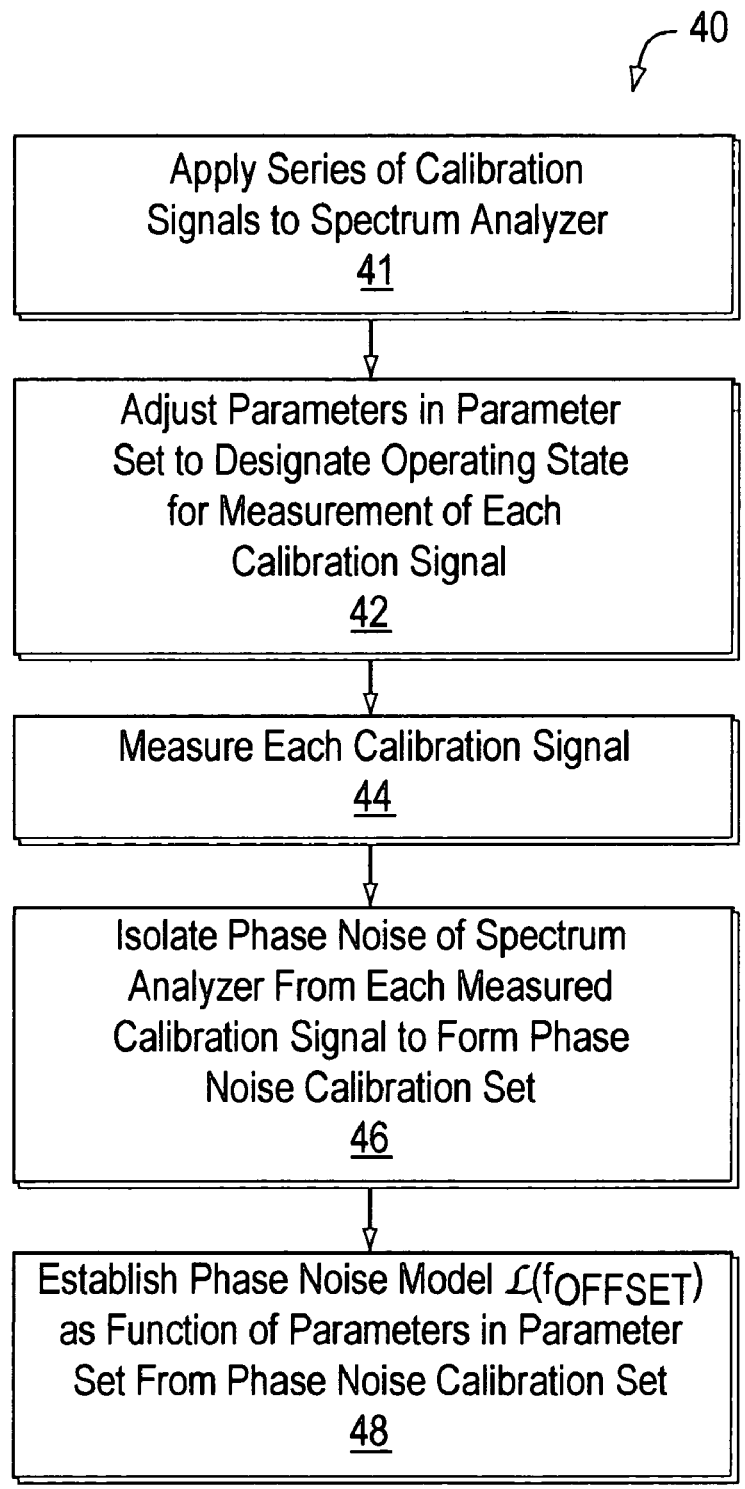
FIG. 4 shows a flow diagram for establishing a phase noise model according to embodiments of the present invention.

FIG. 4 shows a flow diagram 40 for establishing the phase noise model $\mathcal{L}(f_{OFFSET})$, which includes applying a series of calibration signals $S1_{CAL} \ldots SN_{CAL}$ to the spectrum analyzer 10 (step 41). The calibration signals $S1_{CAL} \ldots SN_{CAL}$ stimulate the spectrum analyzer 10 at a sufficient number of frequencies or other stimulus conditions to enable the phase noise $\phi_{SA}$ of the spectrum analyzer 10 to be represented at predetermined frequency offsets $f_{OFFSET}$ and at the various parameter settings that designate the operating states of the spectrum analyzer 10.

In step 42 of the flow diagram 40, the parameters in the parameter set 13 are adjusted to settings $\{f_{OFFSET}, f_{SIF}, P, N, R\}_{CAL}$ that designate corresponding operating states of the spectrum analyzer for the measurement of each of the calibration signals $S1_{CAL} \ldots SN_{CAL}$. Step 44 includes measuring each of the calibration signals $S1_{CAL} \ldots SN_{CAL}$ at the center frequency CF, frequency span SPAN and resolution bandwidth RBW determined by the operating state designated by the settings $\{f_{OFFSET}, f_{SIF}, P, N, R\}_{CAL}$ of the parameters in the parameter set 13. The phase noise $\phi_{SA}$ of the spectrum analyzer 10 at predetermined frequency offsets $f_{OFFSET}$ from the measured calibration signals is isolated in step 46 to form a phase noise calibration set $\phi_{CAL}\{f_{OFFSET}, f_{SIF}, P, N, R\}_{CAL}$, which is a function of the parameters in the parameter set 13 adjusted to the settings $\{f_{OFFSET}, f_{SIF}, P, N, R\}_{CAL}$. The calibration signals $S1_{CAL} \ldots SN_{CAL}$ applied to the spectrum analyzer have substantially lower phase noise than the spectrum analyzer 10, so that the phase noise of each measured calibration signal is attributed to the spectrum analyzer 10. Alternatively, the phase noise of the calibration signals $S1_{CAL} \ldots SN_{CAL}$ has low uncertainty, so that the phase noise $\phi_{SA}$ of the spectrum analyzer 10 can be isolated by subtracting, on a linear power scale, the phase noise of the calibration signals from the total phase noise that is measured by the spectrum analyzer, where this subtraction is performed at the frequency offsets $f_{OFFSET}$.

Step 48 includes establishing the phase noise model $\mathcal{L}(f_{OFFSET})$ as a set of functions F of the frequency offsets $f_{OFFSET}$ and the parameters in the parameter set 13. When the parameter set includes the exemplary parameters of table 1, the phase noise model is expressed as $\mathcal{L}(f_{OFFSET})=F\{f_{OFFSET}, f_{SIF}, P, N, R\}$. The functions F include a series of contours, typically represented by coefficients, polynomial terms, or elements in an array or look-up table, which result from curve fitting or other mappings of phase noise at frequency offsets $f_{OFFSET}$ to the phase noise calibration set $\phi_{CAL}\{f_{OFFSET}, f_{SIF}, P, N, R\}_{CAL}$ established in step 46.

In one example, the set of functions F are linear, wherein each function Fx within the set of functions F has a slope m that is a function of the sampler IF polarity P, the sampler harmonic number N and the PLL divide ratio R. Each function Fx also has an offset b that is a function of the sampler IF polarity P, the sampler harmonic number N and PLL divide ratio R. The linear relationship for the modeled phase noise of the spectrum analyzer 10 and sampler IF frequency $f_{SIF}$ for each setting or adjustment of the sampler IF polarity P, the sampler harmonic number N and the PLL divide ratio R, at the offset frequency $f_{OFFSET}$, is expressed as $\mathcal{L}(f_{OFFSET})=m\{f_{OFFSET}, P, N, R\}f_{SIF}+b\{f_{OFFSET}, P, N, R\}$.

The phase noise model $\mathcal{L}(f_{OFFSET})$ provides a mapping or correspondence between phase noise $\phi_{SA}$ of the spectrum analyzer 10 at frequency offsets $f_{OFFSET}$, and settings of the parameters in the parameter set 13. Thus, for a given operating state of the spectrum analyzer 10 that is designated by the parameters, the phase noise $\phi_{SA}$ of the spectrum analyzer 10 can be determined from the phase noise model $\mathcal{L}(f_{OFFSET})$. Typically, the phase noise model $\mathcal{L}(f_{OFFSET})$ is stored in a memory or other storage medium (not shown) that is accessible to the controller 14.

Figure 5A:
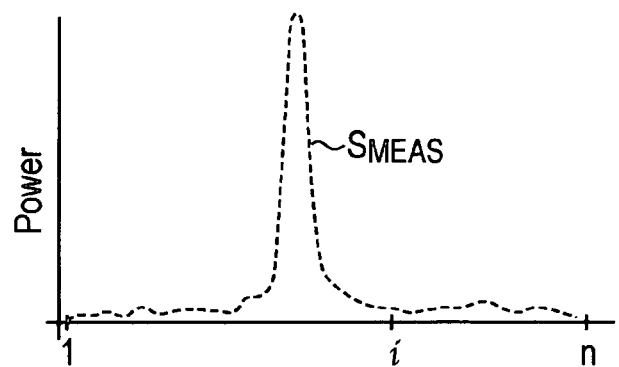
FIGS. 5A–5B show exemplary signals relevant to the embodiments of the present invention.

Once the phase noise model $\mathcal{L}(f_{OFFSET})$ is established, applied signals are subsequently measured by the spectrum analyzer 10. For example, the measurement acquisition unit 18 receives the signal $S_{IN}$ and acquires a measurement trace $S_{MEAS}$ that represents the signal $S_{IN}$. The measurement trace $S_{MEAS}$, typically stored in a display memory 24, is acquired at an operating state that includes a designated setting of the center frequency CF, frequency span SPAN, and resolution bandwidth RBW. The measurement trace $S_{MEAS}$ has a predetermined number of measurement points n, designated by an integer index i, as shown in FIG. 5A.

Figure 5B:
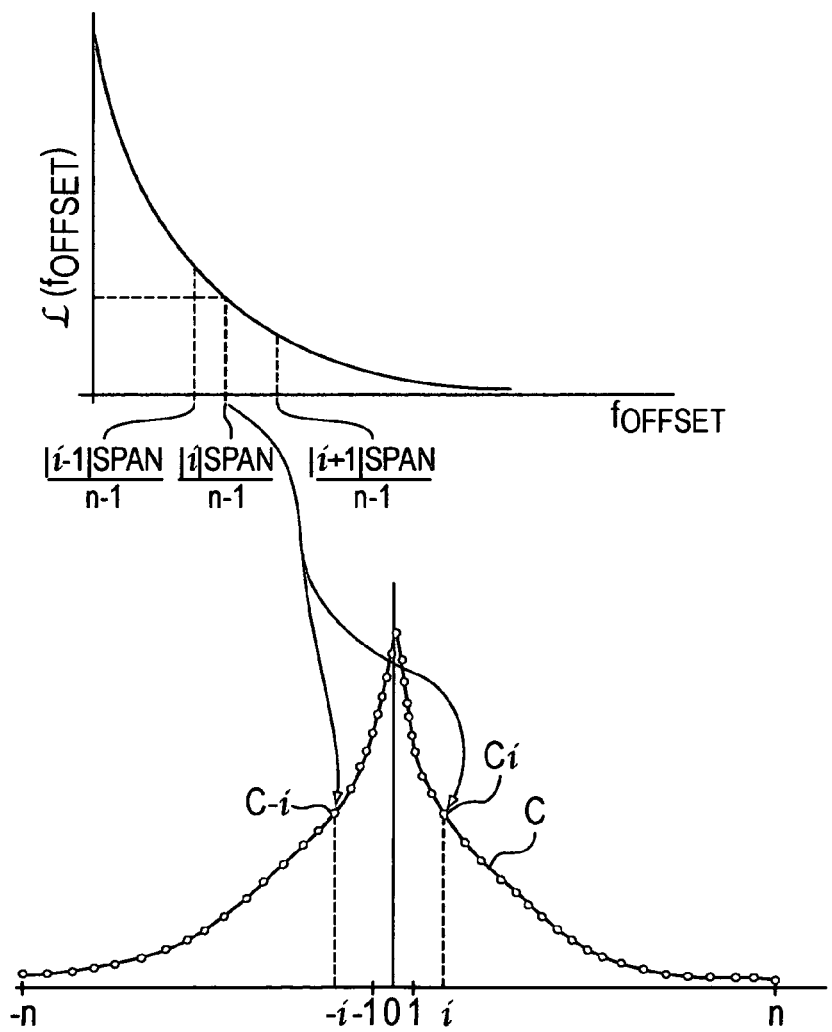

The computational unit 20 forms the array C from the phase noise model $\mathcal{L}(f_{OFFSET})$, based on the frequency span SPAN and the number of measurement points n in the measurement trace $S_{MEAS}$. Typically, the array C is designated to have 2n+1 points, as shown in FIG. 5B. Each point in the array C, designated by the index i, has a corresponding value Ci, established from the phase noise model $\mathcal{L}(f_{OFFSET})$ evaluated at offset frequencies $f_{OFFSET}=|i|$SPAN$/(n-1)$. The array C comprises a set of values Ci that are power ratios expressed on a linear scale. For an array C having 2n+1 points, the indices i of the values Ci are integers that vary from −n to n.

In one example, the values Ci of the array C at each index i is established according to equation 2.

$$Ci = NBW \, 10^{0.1 \mathcal{L}(SPAN(|i|)/(n-1))} \quad (2)$$

In equation 2, the term NBW represents the noise bandwidth of the spectrum analyzer 10, established based on the setting of the resolution bandwidth RBW of the spectrum analyzer 10. The noise bandwidth NBW is typically a designated multiple of the resolution bandwidth RBW.

The signal processor 22 applies the array C to the measurement trace $S_{MEAS}$ to extract the output signal $S_{OUT}$. Applying the array C typically includes a numerical convolution of the measurement trace $S_{MEAS}$ with the array C and a subtraction of the resulting convolution $S_{MEAS}*C$ from the measurement trace $S_{MEAS}$. The measurement trace $S_{MEAS}$ and the array C are each expressed on a linear power scale for this processing by the signal processor 22. While the resulting convolution $S_{MEAS}*C$ has 3n+1 points when the measurement trace $S_{MEAS}$ has n points and the array C has 2n+1 points, the middle n points of the resulting convolution $S_{MEAS}*C$ are used in the subtraction of the resulting convolution $S_{MEAS}*C$ from the n measurement points in the measurement trace $S_{MEAS}$.

The output signal $S_{OUT}$ provided by the signal processor 22 as a result of applying the array C to the measurement trace $S_{MEAS}$ is expressed in equation 3.

$$S_{OUT} = S_{MEAS} - S_{MEAS}*C \quad (3)$$

Due to the influence of the phase noise $\phi_{SA}$ of the spectrum analyzer 10 on the measurements acquired by the spectrum analyzer 10, an expression for the output signal $S_{OUT}$ results in equation 4, where the term $S_{INm}$ depicts the signal $S_{IN}$ at the n measurement points.

$$S_{OUT} = S_{INm} + S_{INm}*\phi_{SA} - S_{INm}*C - S_{INm}*\phi_{SA}*C \quad (4)$$

Since the array C provides an estimate of the phase noise $\phi_{SA}$ of the spectrum analyzer 10, the array C is approximately equal to the phase noise $\phi_{SA}$ of the spectrum analyzer 10, causing the output signal $S_{OUT}$ to be approximately equal to $S_{INm} - S_{INm}*\phi_{SA}*C$. Because the phase noise $\phi_{SA}$ of the spectrum analyzer 10 and the array C have low values when expressed on linear power scales, the term $S_{INm}*\phi_{SA}*C$ in the expression for $S_{OUT}$ is negligible relative to the term $S_{INm}$. Thus, the resulting output signal $S_{OUT}$ is approximately equal to $S_{INm}$, and is a representation of the signal $S_{IN}$ that includes compensation to reduce the influence of the phase noise $\phi_{SA}$ of the spectrum analyzer 10.

Figure 6:
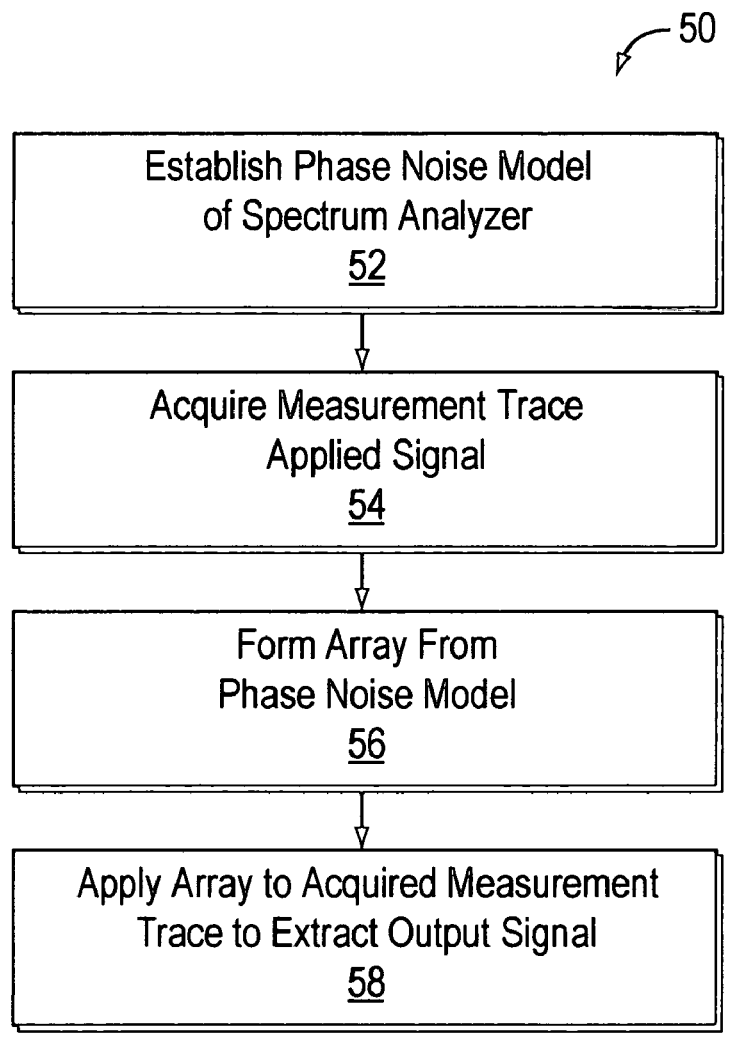
FIG. 6 shows a flow diagram of a phase noise compensation method according to alternative embodiments of the present invention.

FIG. 6 shows a flow diagram of a phase noise compensation method 50 according to alternative embodiments of the present invention. Step 52 includes establishing the phase noise model for the spectrum analyzer. This step in the phase noise compensation method 50 typically includes applying the series of calibration signals $S1_{CAL} \ldots SN_{CAL}$ to the spectrum analyzer 10, and adjusting the parameters in the parameter set 13 to the settings $\{f_{OFFSET}, f_{SIF}, P, N, R\}_{CAL}$ to designate corresponding operating states of the spectrum analyzer for the measurement of each of the calibration signals $S1_{CAL} \ldots SN_{CAL}$. Each of the calibration signals $S1_{CAL} \ldots SN_{CAL}$ is then measured at the center frequency CF, frequency span SPAN and resolution bandwidth RBW determined by the designated operating state. Then, the phase noise $\phi_{SA}$ of the spectrum analyzer 10 is isolated at predetermined frequency offsets $f_{OFFSET}$ from the measured calibration signal to form the phase noise calibration set $\phi_{CAL}\{f_{OFFSET}, f_{SIF}, P, N, R\}_{CAL}$, when the parameter set 13 includes the parameters of table 1. Then, the phase noise model $\mathcal{L}(f_{OFFSET})$ is established as the set of functions F, of the frequency offsets $f_{OFFSET}$ and the parameters in the parameter set 13.

In step 54, one or more measurement traces $S_{MEAS}$ are acquired by the measurement acquisition unit 18 of the spectrum analyzer in response to the signal $S_{IN}$ applied to the spectrum analyzer 10.

In step 56, the array C is formed from the phase noise model, based on the operating state of the spectrum analyzer 10 designated by the parameter set 13, including, for example, the frequency span SPAN, and the number of measurement points n in the measurement trace $S_{MEAS}$. While step 54 is shown proceeding step 56, the array C can be formed before or after the acquisition of measurement traces $S_{MEAS}$.

Step 58 includes applying the array C to the measurement trace $S_{MEAS}$ to extract the output signal $S_{OUT}$. This typically includes a numerical convolution of the measurement trace $S_{MEAS}$ with the array C and then a subtraction of the resulting convolution $S_{MEAS}*C$ from the measurement trace $S_{MEAS}$, where the measurement trace $S_{MEAS}$ and the array C are each expressed on a linear power scale.

While the embodiments of the present invention have been illustrated in detail, it should be apparent that modifications and adaptations to these embodiments may occur to one skilled in the art without departing from the scope of the present invention as set forth in the following claims.

What is claimed is:

1. A method, comprising:
    establishing a phase noise model of a spectrum analyzer at a series of operating states;
    forming an array from the phase noise model based on a designated operating state of the spectrum analyzer; and
    applying the array to a measurement trace acquired by the spectrum analyzer at the designated operating state to extract an output signal.

2. The method of claim 1 wherein establishing the phase noise model includes applying a series of calibration signals to the spectrum analyzer, designating a corresponding operating state of the spectrum analyzer for measuring each of the calibration signals in the series, and isolating the phase noise of the spectrum analyzer from the measured calibration signals.

3. The method of claim 1 wherein applying the array includes convolving the array with the measurement trace, and subtracting from the measurement trace the result of the convolving of the array with the measurement trace.

4. The method of claim 2 wherein applying the array includes convolving the array with a measurement trace, and subtracting from the measurement trace the result of the convolving of the array with the measurement trace.

5. The method of claim 1 wherein forming the array includes establishing a set of values from the phase noise model according to a frequency span of the measurement trace, and a number of measurement points in the measurement trace.

6. The method of claim 2 wherein forming the array includes establishing a set of values from the phase noise model according to a frequency span of the measurement trace, and a number of measurement points in the measurement trace.

7. The method of claim 3 wherein forming the array includes establishing a set of values from the phase noise model according to a frequency span of the measurement trace, and a number of measurement points in the measurement trace.

8. The method of claim 1 wherein the series of operating states of the spectrum analyzer and the designated operating state are designated by a parameter set including a sampler intermediate frequency, a sampler intermediate frequency polarity, a sampler harmonic number and a phase lock loop divide ratio.

9. The method of claim 1 wherein the phase noise model includes a set of functions of a parameter set that designates the series of operating states of the spectrum analyzer and the designated operating state.

10. The method of claim 8 wherein the model includes a set of functions of the parameter set.

11. A system, comprising:
   a computational unit receiving a set of parameters and forming an array from a phase noise model of a spectrum analyzer at a series of operating states that is dependent on a parameter set; and
   a signal processor receiving a measurement trace acquired by the spectrum analyzer at a designated operating state and applying the array to the measurement trace to extract an output signal.

12. The system of claim 11 wherein the phase noise model depends on the parameter set and a calibration set.

13. The system of claim 11 wherein the parameter set includes a sampler intermediate frequency, a sampler intermediate frequency polarity, a sampler harmonic number and a phase lock loop divide ratio.

14. The system of claim 12 wherein the calibration set is based applying a series of calibration signals to the spectrum analyzer, designating a corresponding operating state of the spectrum analyzer for measuring each of the calibration signals in the series of calibration signals, and isolating the phase noise of the spectrum analyzer from corresponding measurements of the calibration signals.

15. The system of claim 13 wherein the calibration set is based applying a series of calibration signals to the spectrum analyzer, designating a corresponding operating state of the spectrum analyzer for measuring each of the calibration signals in the series of calibration signals, and isolating the phase noise of the spectrum analyzer from corresponding measurements of the calibration signals.

16. The system of claim 11 wherein the signal processor convolves the array with the measurement trace, and subtracts from the measurement trace the result of the convolution of the array with the measurement trace.

17. The system of claim 12 wherein the signal processor convolves the array with the measurement trace, and subtracts from the measurement trace the result of the convolution of the array with the measurement trace.

18. The system of claim 13 wherein the signal processor convolves the array with the measurement trace, and subtracts from the measurement trace the result of the convolution of the array with the measurement trace.

19. The system of claim 14 wherein forming the array includes establishing a set of values from the phase noise model according to a frequency span of the measurement trace, and a number of measurement points in the measurement trace.

20. The system of claim 15 wherein forming the array includes establishing a set of values from the phase noise model determined according to a frequency span of the measurement trace, and a number of measurement points in the measurement trace.

* * * * *